(12) United States Patent
Kim

(10) Patent No.: US 7,682,901 B2
(45) Date of Patent: Mar. 23, 2010

(54) METHOD FOR FABRICATING NONVOLATILE MEMORY DEVICE

(75) Inventor: Hae-Soo Kim, Kyoungki-do (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 7 days.

(21) Appl. No.: 12/164,574

(22) Filed: Jun. 30, 2008

(65) Prior Publication Data

US 2009/0117728 A1    May 7, 2009

(30) Foreign Application Priority Data

Nov. 1, 2007    (KR)    ........................ 10-2007-0111191

(51) Int. Cl.
*H01L 21/336*    (2006.01)

(52) U.S. Cl. ..................... 438/257; 438/265; 438/424; 257/E21.54

(58) Field of Classification Search ................. 438/594, 438/257
See application file for complete search history.

(56) References Cited

U.S. PATENT DOCUMENTS 5,328,867 A *    7/1994    Chien et al. ................. 438/301

7,303,957 B2 *    12/2007    Chi et al. .................... 438/257
7,494,874 B2 *    2/2009    Ahn ........................... 438/265

OTHER PUBLICATIONS

Werner Kern, Semiconductor wafer cleaning Technology, New Jersey: Noyes Publications, 1993, Part 2, pp. 119-121.*

* cited by examiner

*Primary Examiner*—Matthew Smith
*Assistant Examiner*—Wilner Jean Baptiste
(74) *Attorney, Agent, or Firm*—Lowe Hauptman Ham & Berner, LLP

(57) ABSTRACT

A method for fabricating a nonvolatile memory device includes forming a tunneling insulation layer and a conductive layer for a floating gate over a substrate, partially etching the conductive layer, the tunneling insulation layer, and the substrate to form a trench, forming an isolation layer filling a portion of the trench, forming spacers on both sidewalls of the conductive layer not covered by the isolation layer, recessing a portion of the exposed isolation layer using the spacers as an etch barrier layer to form wing spacers, removing the spacers, performing a primary cleaning process on the resulting substrate using a mixed solution of $H_2SO_4$ and $H_2O_2$ and a mixed solution of $NH_4OH$, $H_2O_2$, and $H_2O$, and performing a secondary cleaning process on the resulting structure using a mixed solution of a HF solution and a deionized water and a mixed solution of $NH_4OH$, $H_2O_2$, and $H_2O$.

6 Claims, 7 Drawing Sheets

METHOD FOR FABRICATING NONVOLATILE MEMORY DEVICE

CROSS-REFERENCE TO RELATED APPLICATIONS

The present invention claims priority of Korean patent application number 10-2007-0111191, filed on Nov. 1, 2007, which is incorporated by reference herein in its entirety.

BACKGROUND OF THE INVENTION

The present invention relates to a method for fabricating a nonvolatile memory device, and more particularly, to a method for fabricating a NAND-type flash memory device in which a plurality of memory cells are connected in series to form a unit string.

A NAND-type flash memory device is a nonvolatile memory device in which a plurality of memory cells is connected in series to form a unit string in order for realizing a high integration of the memory device. The application fields of the NAND-type flash memory device have expanded to the extent that the NAND-type flash memory replaces a memory stick, a universal serial bus (USB) driver, and a hard disk.

The NAND-type flash memory device is very vulnerable to interference between adjacent cells because a plurality of memory cells is connected in series to form the unit string. A wing spacer technique has been proposed to improve the interference effect in the fabrication of the NAND-type flash memory device using an advanced self aligned-shallow trench isolation (ASA-STI) process. This technique uses a conductive control gate to shield the adjacent floating gates from each other.

In the typical fabricating process of the NAND-type flash memory device using the wing spacer technique, however, an etching process for forming wing spacers is additionally performed and foreign particles are produced. Therefore, if a dielectric layer is formed through a subsequent process, the foreign particles exist within the dielectric layer, leading to degradation of device characteristics.

SUMMARY OF THE INVENTION

Embodiments of the present invention contemplate a method for fabricating a nonvolatile memory device such as a NAND-type flash memory device using a wing spacer technique, which is capable of stably removing foreign particles generated in a wing spacer forming process, thereby improving operation characteristics of the nonvolatile memory device.

In accordance with an embodiment of the present invention, there is provided a method for fabricating a nonvolatile memory device. The method includes forming a tunneling insulation layer and a conductive layer for a floating gate over a substrate, partially etching the conductive layer, the tunneling insulation layer, and the substrate to form a trench, forming an isolation layer filling a portion of the trench, forming spacers on both sidewalls of the conductive layer which is not covered by the isolation layer. Further, a portion of the exposed isolation layer is recessed using the spacers as an etch barrier layer to form a wing spacer. The spacers are then removed and a primary cleaning process on the resulting substrate is performed where the spacers are removed. Further, a mixed solution of sulphuric acid ($H_2SO_4$) and hydrogen peroxide ($H_2O_2$) and a mixed solution of ammonium hydroxide ($NH_4OH$), $H_2O_2$, and $H_2O$ is used, and a secondary cleaning process on the resulting structure, where the primary cleaning process is completed, is performed using a mixed solution of a hydrogen fluoride (HF) solution and a deionized water and a mixed solution of $NH_4OH$, $H_2O_2$, and $H_2O$.

DETAILED DESCRIPTION OF SPECIFIC EMBODIMENTS

Figure 1A:
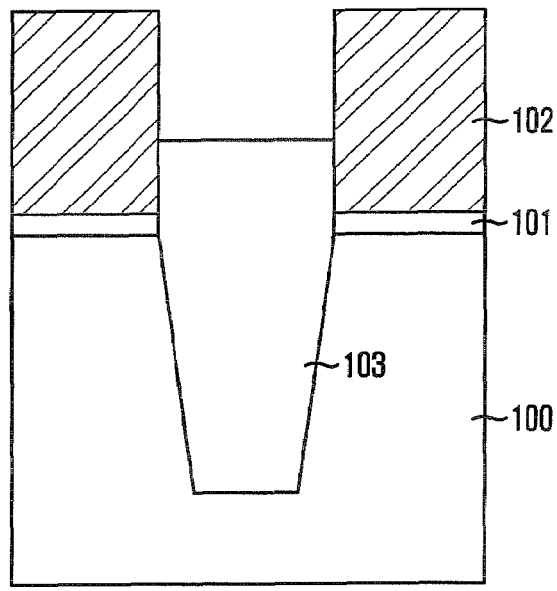
FIGS. 1A to 1G illustrate a method for fabricating a nonvolatile memory device in accordance with an embodiment of the present invention.

In the following detailed description, for purposes of explanation, numerous specific details are set forth in order to provide a thorough understanding of the present invention. It will be apparent however, that the present invention may be practiced without these specific details. Hereinafter, a method for fabricating a nonvolatile memory device in accordance with the embodiments of the present invention will be described in detail with reference to the accompanying drawings.

In the figures, the dimensions of layers and regions are exaggerated for clarity of illustration. It will also be understood that when a layer is referred to as being "on/under" another layer or substrate, it can be directly on/under the other layer or substrate, or intervening layers may also be present. Like reference numerals refer to like elements throughout the drawings. In addition, changes to the English characters of the reference numerals of layers refer to a partial deformation of the layers by an etch process or a polishing process.

FIGS. 1A to 1G illustrate a method for fabricating a nonvolatile memory device in accordance with an embodiment of the present invention. For the convenience of explanation, the following description will be focused on a cell region where memory cells are formed.

Referring to FIG. 1A, a triple n-type well (not shown) and p-type well (not shown) are formed in a substrate 100, e.g., a p-type substrate.

An ion implantation process for adjusting a threshold voltage is performed. A tunneling insulation layer 101 is formed over the substrate 100. The tunneling insulation layer 101 may include an oxide layer, e.g., a silicon dioxide ($SiO_2$) layer. After forming the silicon dioxide layer, a thermal treatment using a nitrogen ($N_2$) gas may be performed to further form a nitride layer in an interface between the silicon dioxide layer and the substrate 100. In addition, the tunneling insulation layer 101 may include a metal oxide layer. Examples of the metal oxide layer include an aluminum oxide ($Al_2O_3$) layer, a zirconium oxide ($ZrO_2$) layer, a hafnium oxide ($HfO_2$) layer, which have a dielectric constant of more than approximately 3.9, and a combined or stacked layer thereof. The tunneling insulation layer 101 may be formed by using a dry oxidation process, a wet oxidation process, or an oxidation process using radical ion. Further, it is also within the scope of the invention to perform the dry oxidation process or the wet oxidation process, according to the characteristics, rather than the oxidation process using the radical ion. The tunneling insulation layer 101 may be formed to a thickness ranging from approximately 50 Å to approximately 100 Å.

A conductive layer 102 for a floating gate is formed over the tunneling insulation layer 101. The conductive layer 102 may be formed of any material having a conductive property. For example, the conductive layer 102 may include a poly-silicon layer, a transition metal layer, or a rare-earth metal layer. The polysilicon layer may be formed of un-doped polysilicon or doped polysilicon. In the case of the un-doped polysilicon layer, impurity ions are separately implanted through a subsequent ion implantation process. For example, the polysilicon layer is formed by using a low pressure chemical vapor deposition (LPCVD) process. In this case, a silane ($SiH_4$) gas is used as a source gas, and a phosphine ($PH_3$) gas, a boron trichloride ($BH_3$), or a diborane ($B_2H_6$) gas is used as a doping gas. Examples of the transition metal include iron (Fe), cobalt (Co), tungsten (W), nickel (Ni), palladium (Pd), platinum (Pt), molybdenum (Mo), or titanium (Ti). Examples of the rare-earth metal include erbium (Er), ytterbium (Yb), samarium (Sm), yttrium (Y), lanthanum (La), cerium (Ce), terbium (Tb), dysprosium (Dy), holmium (Ho), thulium (Tm), or lutetium (Lu).

A hard mask (not shown) may be formed over the conductive layer 102. The hard mask is formed of a material having a high etch selectivity to the conductive layer 102. For example, when the conductive layer 102 is formed of polysilicon, the hard mask is formed of nitride, e.g., silicon nitride ($Si_3N_4$). In addition, the hard mask may be formed in a stacked structure of a nitride layer (e.g., a silicon nitride layer), an oxide layer (e.g., a silicon oxide layer), and an oxynitride layer (e.g., a silicon oxynitride (SiON) layer).

Before forming the hard mask, a buffer layer (not shown) may be further formed to protect the conductive layer 102. The buffer layer may be formed of silicon oxide.

The conductive layer 102, the tunneling insulation layer 101, and the substrate 100 are partially etched to form a trench (not shown). The depth and width of the trench may be adequately controlled in accordance with the device isolation characteristics. In this way, an active region and a field region are defined.

An insulation layer for an isolation layer is deposited inside the trench. The insulation layer may be formed using an undoped silicate glass (USG) layer (hereinafter, referred to as a high density plasma (HDP) layer) by a high density plasma-chemical vapor deposition (HDP-CVD) process having an excellent gap-filling characteristic even at a high aspect ratio, or may be formed in a stacked structure of an HDP layer and a spin on dielectric (SOD) layer. The SOD layer may include a polisilazane (PSZ) layer.

The insulation layer is planarized. The planarization process may be performed by an etching process (e.g., an etch back process) using a plasma etch apparatus, or a chemical mechanical polishing process (CMP) process.

A portion of the insulation layer is recessed to form an isolation layer 103 filling the trench to a predetermined depth. In the recess process (i.e., the etching process) for forming the isolation layer 103, a photoresist pattern (not shown) opening a cell region and blocking a peripheral region is used as an etch mask. The peripheral region is a region where driver circuits (e.g., a decoder and a page buffer) for driving the memory cell formed in the cell region are formed. The etching process may be performed using a dry etching process or a wet etching process.

Figure 1B:
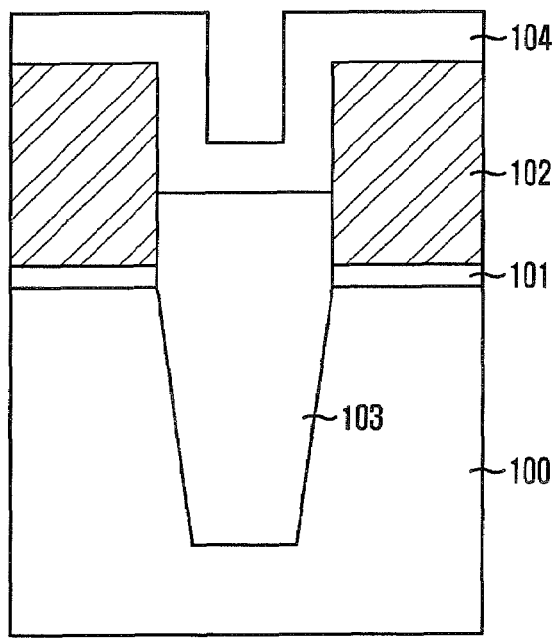

Referring to FIG. 1B, an insulation layer 104 for a spacer is formed along a surface profile of the resulting structure including the isolation layer 103. The insulation layer 104 may be formed of oxide (e.g., silicon oxide), nitride (e.g., silicon nitride), amorphous carbon, or photoresist resin.

Figure 1C:
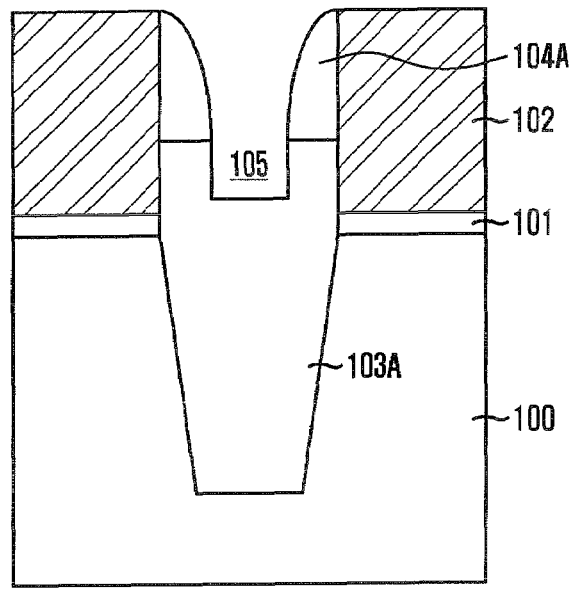

Referring to FIG. 1C, the insulation layer 104 (see FIG. 1B) is etched to form spacers 104A on sidewalls of the conductive layer 102. The etching process is performed by an anisotropic dry etching process. More specifically, the etching process is performed by an etch back process using a plasma etch apparatus.

An upper portion of an exposed isolation layer 103A is partially recessed using the spacers 104A as an etch barrier layer to form a recess 105. As a result, protrusions, i.e., wing spacers, are formed over both sides of the upper portion of the isolation layer 103A. The protrusions protrude toward portions covered with the spacers 104A, respectively.

Figure 1D:
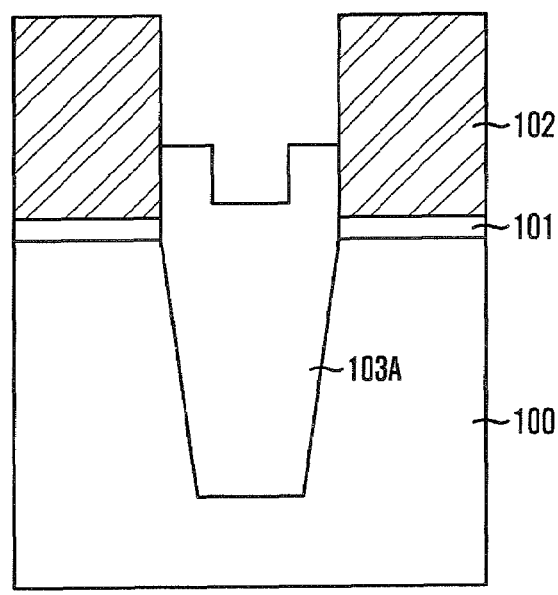

Referring to FIG. 1D, the spacers (104A in FIG. 5C) are selectively removed. The spacer removal process may be performed using a dry etching process or a wet etching process. In the spacer removal process, an etch gas or an etch solution may be adequately selected according to material. For example, in the wet etching process, a diluted hydrogen fluoride (DHF) solution, a buffered HF (BHF) solution, or a buffered oxide etch solution is used as the etch solution when the spacers 104A is formed of silicon oxide.

Figure 1E:
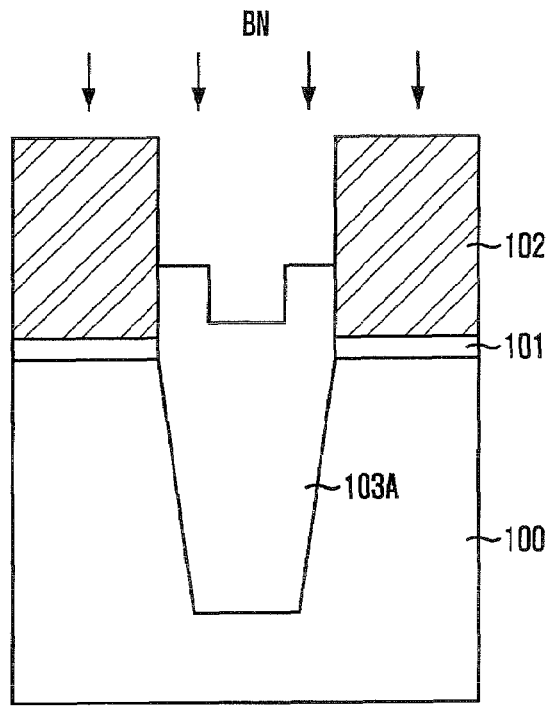
Figure 1F:
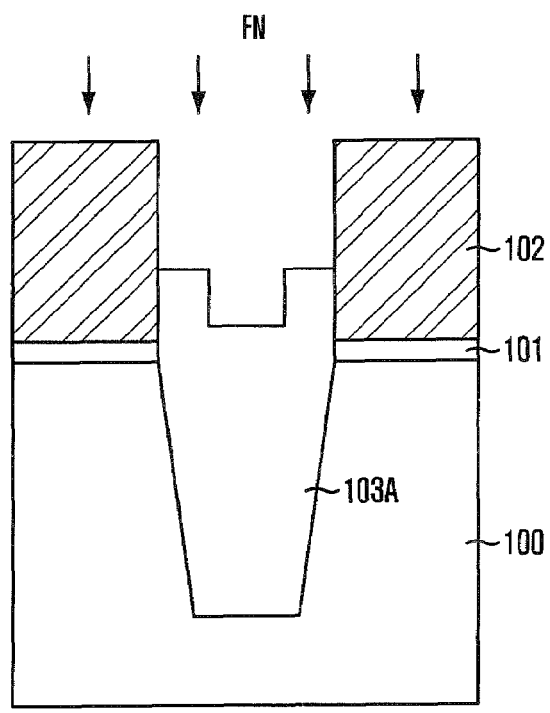

Referring to FIGS. 1E and 1F, a cleaning process is performed while the conductive layer 102 damaged due to the wing spacer formation process and the spacer removal process is recovered. The cleaning process removes foreign particles produced in the wing spacer formation process and the spacer removal process. The cleaning process is performed in two steps.

Referring to FIG. 1E, a primary cleaning process is performed for recovering the damaged conductive layer 102. The primary cleaning process is performed using a benzonitrile (BN) solution as a cleaning solution for at most 270 seconds, preferably approximately 230 seconds to approximately 270 seconds. In the BN solution, "B" denotes a mixed solution of $H_2SO_4$ and $H_2O_2$ wherein a mixing ratio of the $H_2SO_4$ to $H_2O_2$ is approximately 4:1, and "N" denotes a mixed solution of $NH_4OH$, $H_2O_2$, and $H_2O$, wherein a mixing ratio of the $NH_4OH$ to the $H_2O_2$ to the $H_2O$ is approximately 1:4:20.

Referring to FIG. 1F, a secondary cleaning process is performed for removing the foreign substances like particles. The secondary cleaning process is performed using a FN solution as the cleaning solution for at least 110 seconds, preferably approximately 110 seconds to approximately 150 seconds. In the FN solution, "F" denotes a mixed solution of an HF solution and deionized water, wherein a mixing ratio of the HF to the deionized water is approximately 100:1, and "N" denotes the mixed solution of $NH_4OH$, $H_2O_2$, and $H_2O$, wherein a mixing ratio of $NH_4OH$ to the $H_2O_2$ to the $H_2O$ is approximately 1:4:20.

A threshold voltage distribution in accordance with a processing time of the primary cleaning process CLN1 and the secondary cleaning process CLN2 will be described below.

TABLE 1

| | Wafer (W/F) | | | | | |
|---|---|---|---|---|---|---|
| | | | | Threshold voltage variation (V) when all cell data are "0" | | |
| Processing time | Erasion | | | | | |
| (total 380 seconds) | Δ1k | Δ10k | Δ30k | Δ1k | Δ10k | Δ30k |
| #11 CLN1: 310 seconds CLN2: 70 seconds | 0.87 | 2.04 | 2.97 | 0.49 | 1.11 | 1.92 |
| #12 CLN1: 290 seconds CLN2: 90 seconds | 0.90 | 2.19 | 3.32 | 0.47 | 1.23 | 2.41 |

TABLE 1-continued

| | | Wafer (W/F) | | | | | |
| --- | --- | --- | --- | --- | --- | --- | --- |
| | Processing time | Erasion | | | Threshold voltage variation (V) when all cell data are "0" | | |
| | (total 380 seconds) | Δ1k | Δ10k | Δ30k | Δ1k | Δ10k | Δ30k |
| #13 | CLN1: 270 seconds CLN2: 110 seconds | 0.85 | 2.00 | 2.96 | 0.46 | 0.98 | 1.62 |
| #14 | CLN1: 250 seconds CLN2: 130 seconds | 0.86 | 2.01 | 2.88 | 0.42 | 0.97 | 1.61 |
| #15 | CLN1: 230 seconds CLN2: 150 seconds | 0.89 | 1.91 | 2.71 | 0.47 | 0.98 | 1.45 |

As can be seen from Table 1, when the processing time of the primary cleaning process CLN1 decreases and the processing time of the secondary cleaning process CLN2 increases, the threshold voltage distribution is improved at Δ10 k (E/W (Erase/Write) cycling number). Particularly, Table 1 shows that threshold voltage distribution is improved when the processing time of the primary cleaning process CLN1 is 230 seconds, 250 seconds, and 270 seconds, and the processing time of the secondary cleaning process CLN2 is 110 seconds, 130 seconds, and 150 seconds.

Figure 3:
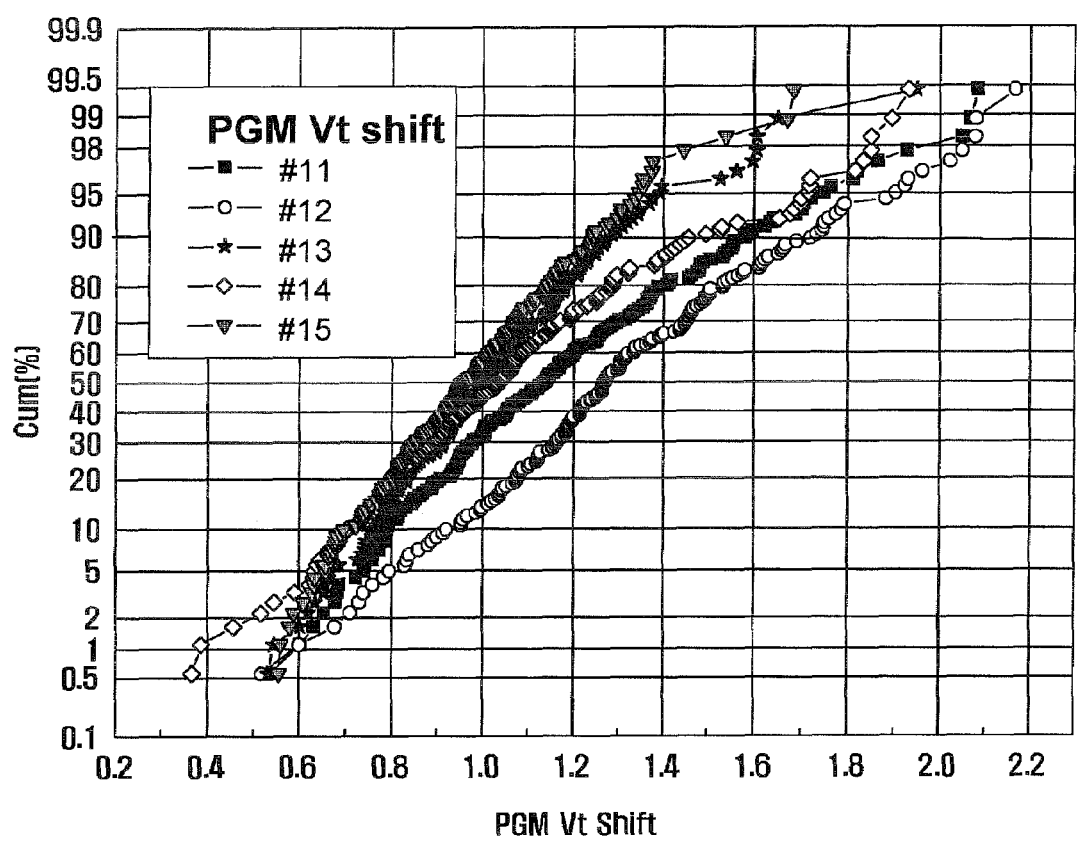
FIGS. 3 and 4 illustrate graphs showing program threshold voltage distribution of a memory cell fabricated by a method for fabricating a nonvolatile memory device in accordance with an embodiment of the present invention.

As can be seen from FIG. 3 showing program threshold voltage distribution in units of each wafer (W/F), the program threshold voltage distribution is improved at #13, #14, and #15.

Figure 4:
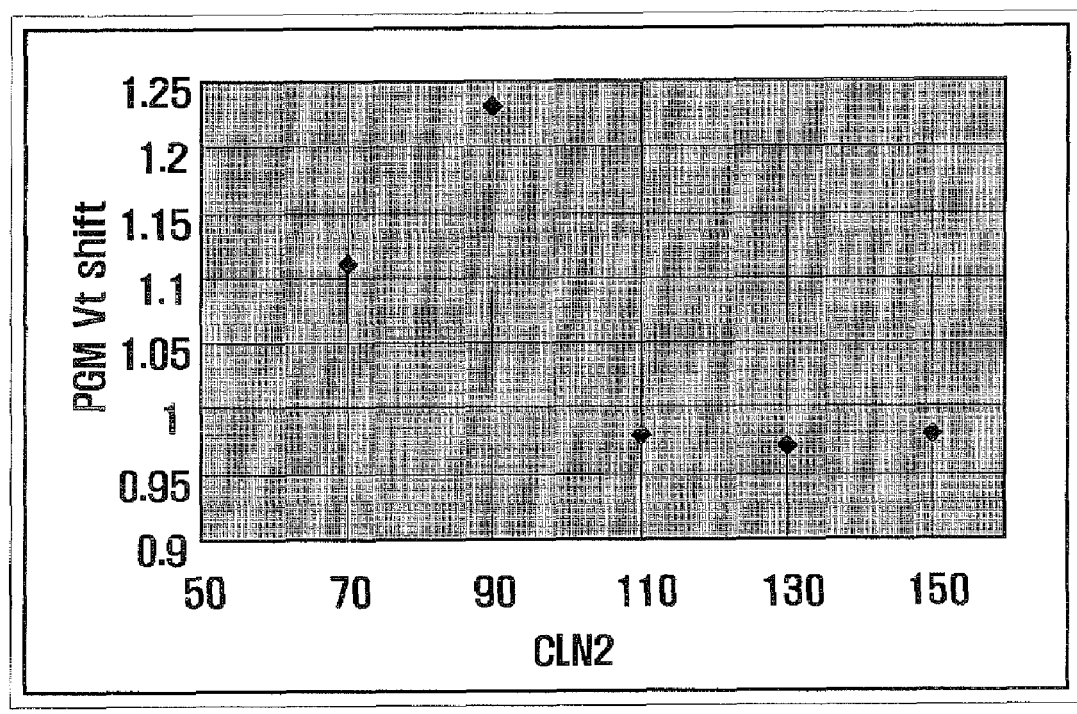

As can be seen from the graph of FIG. 4 showing the program threshold voltage distribution in accordance with the processing time of the secondary cleaning process CLN2, the threshold voltage distribution is also improved at 110 seconds, 130 seconds, and 150 seconds.

Figure 1G:
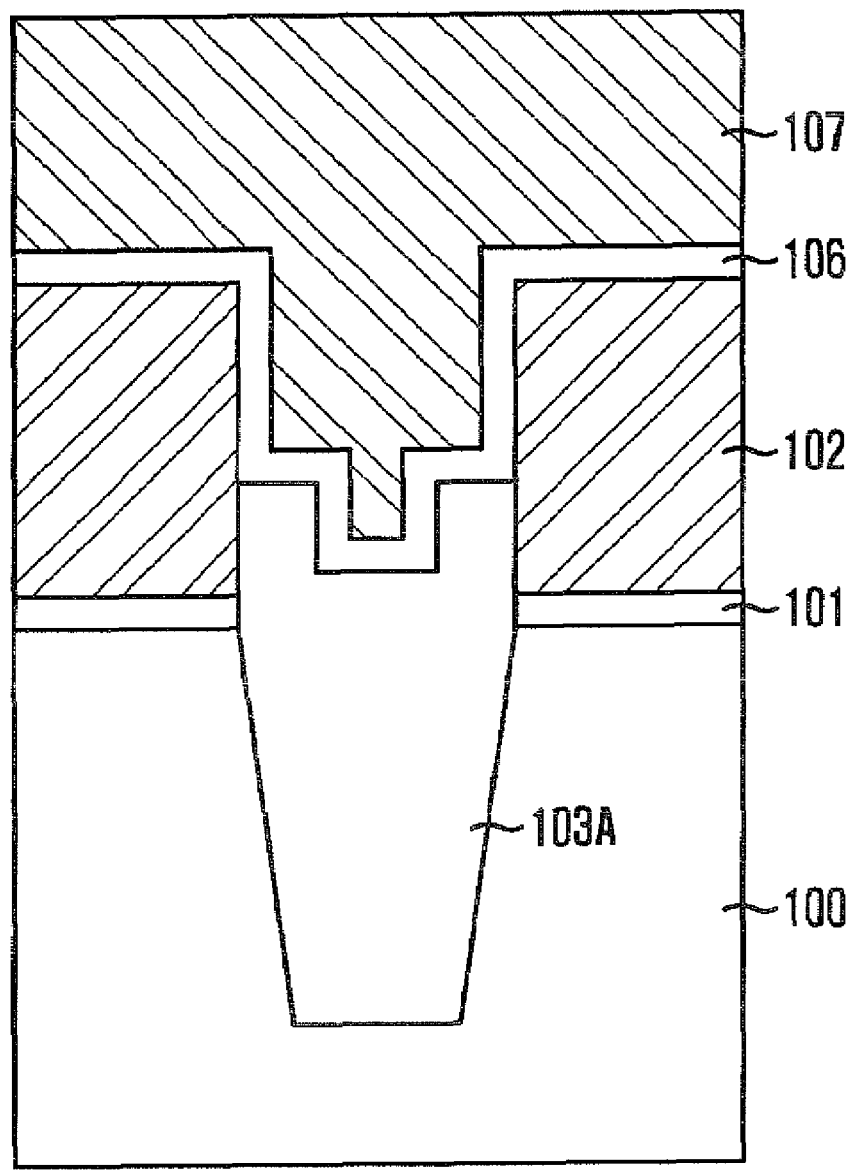

Referring to FIG. 1G, a dielectric layer 106 is formed along a surface profile of the resulting structure including the isolation layer 103A. The dielectric layer 106 may be formed in a stacked structure of an oxide-nitride-oxide layer (e.g., a silicon oxide-silicon nitride-silicon oxide layer). Also, the dielectric layer 106 may be formed using a metal oxide layer having a dielectric constant of 3.9 or more, which is higher than that of the silicon oxide layer. Examples of the metal oxide layer include an aluminum oxide ($Al_2O_3$) layer, a zirconium oxide ($ZrO_2$) layer, or a hafnium oxide ($HfO_2$) layer. In addition, the dielectric layer 106 may include a combined or stacked layer of $Al_2O_3$, $ZrO_2$, and $HfO_2$.

A control gate 107 is formed over the dielectric layer 106. The control gate 107 may be formed of the same material as floating gates.

Figure 2:
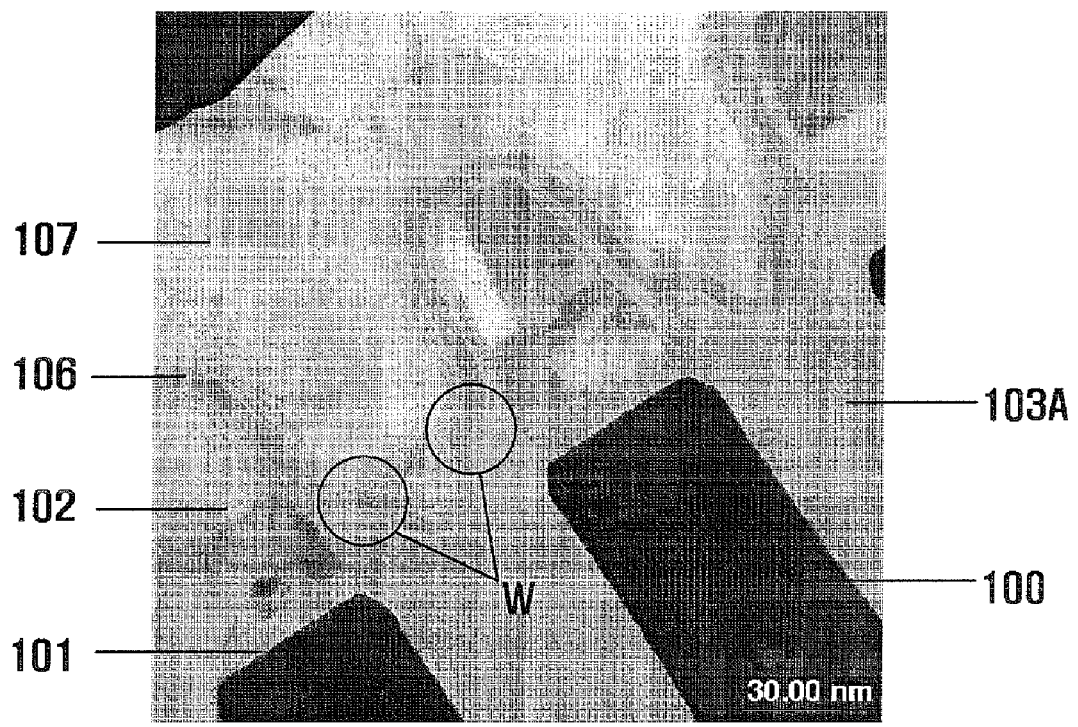
FIG. 2 illustrates a micrographic view of a memory device fabricated by a method for fabricating a nonvolatile memory device in accordance with an embodiment of the present invention.

As a result, as shown in FIG. 2, the wing spacer W is formed on the upper portion of the isolation layer 103A between the floating gates.

Since the following processes are preformed in the same manner as the typical processes, detailed description thereof will be omitted.

In accordance with the disclosed embodiments of the present invention, the two-step cleaning process is performed after the wing spacer formation process and before the dielectric layer formation process to stably remove the foreign particles produced in the wing spacer formation process. Therefore, a pure dielectric layer without containing the foreign particles can be formed. As a result, data retention characteristics of the device, i.e., erase/write (E/W) cycling characteristics, can be improved.

Since the subsequent processes are identical to the typical processes, their detailed description will be omitted.

Although the ASA-STI process has been described above, the embodiments of the present invention can also be applied to a self-aligned floating gate (SAFG) process and a self aligned-STI (SA-STI) process.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a nonvolatile memory device, the method comprising:
    forming a tunneling insulation layer and a conductive layer for a floating gate over a substrate;
    partially etching the conductive layer, the tunneling insulation layer, and the substrate to form a trench;
    forming an isolation layer filling a portion of the trench;
    forming spacers on both sidewalls of the conductive layer which is not covered by the isolation layer;
    recessing a portion of the exposed isolation layer using the spacers as an etch barrier layer to form a wing spacer;
    removing the spacers;
    performing a primary cleaning process on the resulting substrate, where the spacers are removed, using a mixed solution of sulphuric acid ($H_2SO_4$) and hydrogen peroxide ($H_2O_2$) and a mixed solution of ammonium hydroxide ($NH_4OH$), $H_2O_2$, and $H_2O$; and
    performing a secondary cleaning process on the resulting structure, where the primary cleaning process is completed, using a mixed solution of a hydrogen fluoride (HF) solution and a deionized water and a mixed solution of $NH_4OH$, $H_2O_2$, and $H_2O$.

2. The method of claim 1, wherein the primary cleaning process is performed for approximately 230 seconds to approximately 270 seconds, and the secondary cleaning process is performed for approximately 110 seconds to approximately 150 seconds.

3. The method of claim 1, wherein the forming of the spacers comprises:
    forming an insulation layer over the conductive layer including the isolation layer; and
    etching the insulation layer.

4. The method of claim 3, wherein the insulation layer comprises an oxide layer, a nitride layer, an amorphous carbon layer, or a photoresist resin.

5. The method of claim 1, wherein the isolation layer comprises a high density plasma (HDP) layer or a stacked structure of an HDP layer and a spin on dielectric (SOD) layer.

6. The method of claim 1, further comprising, after performing the secondary cleaning process:
    forming a dielectric layer over the conductive layer including the wing spacer; and
    forming a control gate over the dielectric layer.

* * * * *